(12) United States Patent
Yako

(10) Patent No.: US 8,193,064 B2
(45) Date of Patent: Jun. 5, 2012

(54) SEMICONDUCTOR DEVICE AND METHOD OF MANUFACTURING THE SAME

(75) Inventor: Koichi Yako, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/900,615

(22) Filed: Oct. 8, 2010

(65) Prior Publication Data

US 2011/0101457 A1    May 5, 2011

(30) Foreign Application Priority Data

Oct. 14, 2009    (JP) ................. 2009-237590

(51) Int. Cl.
*H01L 21/336* (2006.01)
(52) U.S. Cl. ................. 438/300; 438/306; 257/E21.431
(58) Field of Classification Search .................. 438/519, 438/524; 257/E21.4
See application file for complete search history.

(56) References Cited

U.S. PATENT DOCUMENTS

2011/0068396 A1* 3/2011 Cheng et al. .............. 257/335

FOREIGN PATENT DOCUMENTS

| JP | 2003-031798 | 1/2003 |
|---|---|---|
| JP | 2003-309079 | 10/2003 |
| JP | 2005-033098 | 2/2005 |
| JP | 2005-183550 | 7/2005 |
| JP | 2006-005373 | 1/2006 |
| JP | 2006-108142 | 4/2006 |
| JP | 2006-186349 | 7/2006 |

OTHER PUBLICATIONS

Shaoyin Chen et al—Wafer Temperature Measurement and Control During Laser Spike Annealing—15th IEEE International Conference on Advanced Thermal Processing of Semiconductor—RTP2007—Ju. 7, 2007—pp. 1-6.
T. Noda et al.—Effects of End-of-Range Dislocation Loops on Transient Enhanced Diffusion of Indium Implanted in Silicon—Journal of Applied Physics—vol. 88, No. 9—Nov. 1, 2000.

\* cited by examiner

*Primary Examiner* — Cheung Lee
(74) *Attorney, Agent, or Firm* — Young & Thompson

(57) ABSTRACT

Provided is that the method of manufacturing the semiconductor device including a first process of implanting a first impurity of a first conductivity type in a source and drain region having an elevated structure, with a concentration equal to or less than 1E14 atoms/cm$^2$, on the conditions that the concentration peak thereof is located more deeply than the interface between silicide and a semiconductor substrate, a second process of implanting a second impurity of a first conductivity type having a smaller mass than that of the first impurity in the source and drain region on the conditions that the peak thereof is located more shallowly than the concentration peak of the first impurity, and a third process of applying high-temperature millisecond annealing to the semiconductor substrate after the first and second processes.

8 Claims, 12 Drawing Sheets

SEMICONDUCTOR DEVICE AND METHOD OF MANUFACTURING THE SAME

This application is based on Japanese patent application No. 2009-237590, the content of which is incorporated hereinto by reference.

BACKGROUND

1. Technical Field

The present invention relates to a semiconductor device and a method of manufacturing the same, and particularly, relates to a source and drain structure in an MISFET.

2. Related Art

In recent years, along with the miniaturization and high integration of a metal-insulator-semiconductor field-effect-transistor (MISFET) having a structure obtained by combining three different "metal-insulating film-semiconductor" substances, a diffusion layer has become smaller in depth, and a sidewall spacer has become narrower in width. Herein, the metal is used in a broad sense, including not only a pure metal, but also a semiconductor material having a sufficiently large conductivity or an alloy of the semiconductor and the metal and the like.

The MISFET generally includes a channel region, a gate insulating film, a gate electrode, a source region, and a drain region, regardless of an n-channel conductivity type and a p-channel conductivity type. The diffusion layer refers to the source region and the drain region among these, and, in a region in the vicinity of a gate of the source region and drain region, a region of the diffusion layer called an extension region becomes shallower.

Miniaturization of the MISFET is realized by reducing the width of the gate electrode, decreasing the thickness of the gate insulating film, and reducing the thickness of the extension region. In addition, for the purpose of achieving high integration of the MISFET, it is required to reduce the width of the sidewall spacer in addition to these operations.

The following analyses are given by the present inventor. Japanese Unexamined Patent Publication Nos. 2003-309079, 2005-183550 and 2006-108142 disclose a method of implanting the ions, such as germanium and the like, having a large mass before the formation of the source and drain region, and breaking down (amorphizing) the lattice crystal of the surface of semiconductor substrate, in order to suppress the expansion of the impurity region in a transverse direction at the time of the formation of the source and drain region.

However, there is a problem, in this method, that crystal defects generated by the implantation are extremely large. With the drastic development of scaling in recent years, the prevailing trend is that the impurities are activated through high-temperature millisecond annealing by which little impurity diffusion is brought about. In such an activation method, the defects cannot be completely recovered by amorphization of the substrate surface using germanium and the like, thereby generating an extremely large junction leakage current.

In Japanese Unexamined Patent Publication Nos. 2003-309079, 2005-183550 and 2006-108142 mentioned above, it cannot be said to be sufficient that such defects are reduced as much as possible by the conditions of high-temperature millisecond annealing and the like.

In addition, Japanese Unexamined Patent Publication Nos. 2003-309079, 2005-183550, 2006-186349 and 2006-005373 disclose a method of amorphization with not only germanium but also the same conductivity-type ions having a large mass, using the same conductivity-type plural impurities having a different mass. However, such an element having a large mass also causes great damage to the substrate, and its use in large quantities generates numerous crystal defects in the substrate. Consequently, when only the high-temperature millisecond annealing is applied, the defects cannot be completely recovered, thereby bringing about an increase in the junction leakage.

A correlation between the implantation amount of indium which is a p-type conductive material and the thickness of an amorphous layer formed after the implantation is shown in FIG. 2 of T. Noda, S. Odanaka, H. Umimoto 'Effects of end-of-range dislocation loops on transient enhanced diffusion of indium implanted in silicon' Journal of Applied Physics Vol 88 No 9 p. 4980-4984 2000. According to the same drawing, the relationship of the thicknesses of the amorphous layer with respect to the implantation amount is different when the implantation amount of indium is up to 1E14 atoms/$cm^2$ and when the amount is equal to or more than this value. This is considered to be because when the implantation of the amount equal to or more than 1E14 atoms/$cm^2$ is performed, the amorphous layer is formed up to the depth to which indium is implanted into the substrate by the impurity implantation. When the amorphous layer is deeply formed in this way, the crystal defects cannot be recovered without performing sufficient heat treatment. Consequently, from the viewpoint that the amorphous layer is not deeply formed in the substrate, it is preferable that the implantation amount of the element to be implanted is equal to or less than 1E14 atoms/$cm^2$.

In Japanese Unexamined Patent Publication Nos. 2003-31798 and 2005-33098, the deep portion in the source and drain region is formed with the implantation amount of indium which is a p-type impurity heavier than boron. In addition, the generation of the defects is suppressed by suppressing the implantation amount thereof to 2.5E13 atoms/$cm^2$.

However, in the semiconductor device disclosed in Japanese Unexamined Patent Publication Nos. 2003-31798 and 2005-33098, there is a problem that an increase in the junction leakage is exhibited under the application of the high-temperature millisecond annealing.

The cause of the junction leakage increasing is that there is no controllability in a position of the heavier ions to be implanted, and ions intruding more deeply than the effective depth by the high-temperature millisecond annealing are generated. By using the channeling phenomenon, the impurities are implanted more deeply than the depth to be assumed from the impurity implantation energy used in order to deeply dispose the ions. Since the high-temperature millisecond annealing has a very short period of heating time, the rear surface of the wafer is not heated.

A correlation between temperature and depth from the surface of the wafer when the typical high-temperature millisecond annealing is applied is shown in FIG. 2 of Chen Shaoyin, J. Hebb, A. Jain, S. Shetty, Wang Yun, 'Wafer Temperature Measurement and Control During Laser Spike Annealing', 15th IEEE International Conference on Advanced Thermal Processing of Semiconductors, 2007. pp. 239-244, 2007. According to this, it is known that the temperature is drastically lowered even at a surface temperature of 1400° C. In the method disclosed in Japanese Unexamined Patent Publication No. 2003-31798, the generated crystal defects are certainly small because of a small implantation amount of the impurities. However, when the defects are formed in a deeper position than expected, the heat treatment temperature is lowered, and thus an increase in the junction leakage is brought about.

In addition, as a result of the fact that the width of the sidewall spacer is also reduced with scaling of the transistor, the influence of not only the extension region but also the source and drain region on the transistor characteristics becomes larger. This is because when ions are implanted in the source and drain region, ions changing in a traveling direction are generated by the collision with the crystal of the substrate, and thus there is a phenomenon of the ions intruding in a channel direction. For this reason, the source and the drain come close to each other, and thus a drop in the threshold voltage or an increase in the off current is brought about. Therefore, in the method disclosed in Japanese Unexamined Patent Publication Nos. 2003-31798 and 2005-33098 which use channeling, an increase in variation of the threshold voltage or the off current is brought about.

SUMMARY

In one embodiment, there is provided a method of manufacturing a semiconductor device, in which a substrate is prepared, where a gate electrode disposed over the substrate with a gate insulating film interposed therebetween, a sidewall spacer disposed in the side of the gate electrode, and a region, disposed in the substrate corresponding to both sides of the gate electrode, that includes a first conductivity-type source and drain region having an elevated structure above the interface between the gate insulating film and the substrate are formed, the method including: firstly implanting a first impurity in the region including the source and drain region with an amount equal to or less than 1E14 atoms/cm$^2$, when a silicide region is formed over the source and drain region, on the conditions that the concentration peak of the first impurity of a first conductivity type is located more deeply than the interface between the silicide region and the substrate; secondly implanting a second impurity in the region including the source and drain region, on the conditions that the concentration peak of the second impurity of a first conductivity type, having a smaller mass than that of the first impurity, is located more shallowly than the concentration peak of the first impurity; and thirdly high-temperature millisecond annealing the substrate, subsequently to the step of firstly implanting the first impurity and the step of secondly implanting the second impurity.

The "elevated structure" referred to in this specification means a transistor structure in which the surface of the source and drain region is formed above the surface of the substrate.

In another embodiment, there is a semiconductor device including an MISFET which includes: a substrate; a gate insulating film disposed over the substrate; a gate electrode disposed over the gate insulating film; a sidewall spacer formed in the side of the gate electrode; a first conductivity-type source and drain region, disposed in the substrate corresponding to both sides of the gate electrode, that has an elevated structure above the interface between the gate insulating film and the substrate; and a silicide region disposed over the source and drain region, wherein the source and drain region includes a first impurity of a first conductivity type, and a second impurity of a first conductivity type having a smaller mass than that of the first impurity, the peak concentration of the first impurity is equal to or less than 1E20 atoms/cm$^3$, the concentration peak of the first impurity is located below the interface between the silicide region and the substrate, the peak concentration of the second impurity is equal to or more than 1E20 atoms/cm$^3$, and the concentration peak of the second impurity is located above the concentration peak of the first impurity.

According to the above-mentioned configuration, the source and drain region is formed by the first and second impurities, and the mass of the first impurity implanted in a deep region is made larger, to thereby suppress the amount of generation of the secondary channeling at the time of implantation of the second impurity. Thereby, it is possible to obtain a deep source and drain region while decreasing the intrusion of ions into the extension region. Therefore, it is possible to suppress a short channel effect.

The amount of the crystal defects that can be removed is maintained even in the high-temperature millisecond annealing by setting the implantation amount of the first impurity to be implanted to equal to or less than 1E14 atoms/cm$^2$. Therefore, it is possible to obtain the MISFET having a low junction leakage even under the high-temperature millisecond annealing by using the second impurity having a smaller mass than that of the first impurity.

In addition, in the embodiment, the concentration peak of the first impurity having a large mass is located below the interface between the silicide region and the semiconductor substrate. Therefore, it is possible to obtain the semiconductor device having high reliability by avoiding a situation where the first impurity segregated after the application of the high-temperature millisecond annealing becomes a cause of remaining defects.

Further, it is possible to prevent a decrease in the distance from the end of the sidewall spacer to the end of the source and drain region, with the source and drain region being deeply formed through the elevated structure in which the substrate is lifted to the upper portion. Therefore, it is possible to suppress the short channel effect while reducing the junction leakage.

According to the invention, it is possible to provide a semiconductor device capable of suppressing the short channel effect and reducing the junction leakage.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Before describing of the present invention, the related art will be explained in detail with reference to FIGS. 1A to 1D to facilitate the understanding of the present invention.

Hereinafter, a standard method of manufacturing the MISFET will be shown with reference to FIGS. 1A to 1D.

Figure 1A:
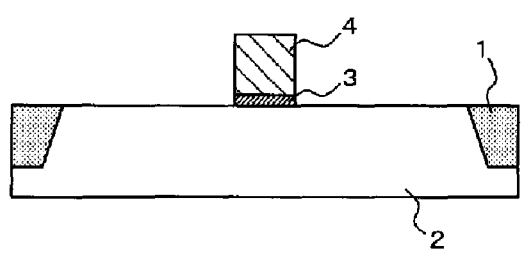
FIGS. 1A to 1D are cross-sectional views illustrating a configuration of an MISFET of the related art.

As shown in FIG. 1A, a gate insulating film 3 and a gate electrode 4 are formed on the main surface of a p-type semiconductor substrate (silicon substrate 2) having an element isolation region 1. In general, the gate insulating film 3 and the gate electrode 4 are formed on the entirety of the main surface of the substrate, and are obtained by etching these elements. There may be a case where different impurities are implanted in the gate electrode 4 at an NMISFET and a PMISFET, or where the NMISFET and the PMISFET are manufactured and separated with different materials.

Figure 1B:
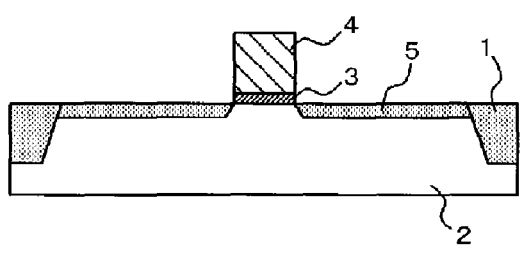

Next, as shown in FIG. 1B, using the gate electrode 4 as a mask, impurities are introduced into the main surface of the silicon substrate 2 by an ion implantation method and the like, and an extension region 5 is formed in a self-aligned manner. At this time, the sidewall called an offset spacer may be formed in the side of the gate electrode 4. In addition, the offset spacer may cover not only the sidewall, but also the silicon substrate 2.

Figure 1C:
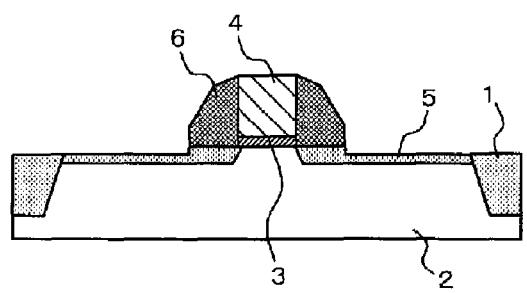

Next, as shown in FIG. 1C, a sidewall spacer 6 is formed. It is formed by forming an insulating film on the extension region 5 and then using anisotropic etching. Herein, the sidewall spacer 6 has a one-layer structure, but may be formed of a plurality of layers.

Figure 1D:
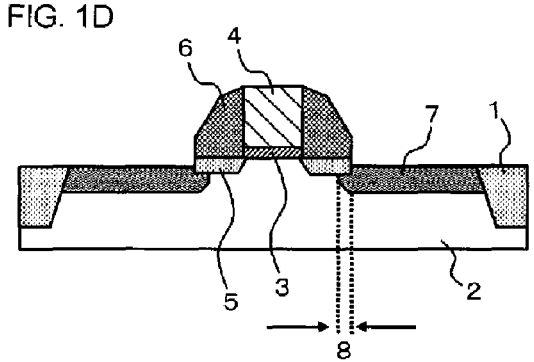

As shown in FIG. 1D, using this sidewall spacer 6 as a mask, an impurity region is formed more deeply than the extension region 5 in a self-aligned manner by the ion implantation method and the like. After that, a source and drain region 7 is formed by activating the impurities implanted through heating treatment with respect to a wafer.

At the time of the formation of the impurity region performed in this case, the sidewall spacer 6 is used as a mask, but the impurity region is formed further up to the gate side. As one of the causes thereof, a change (scattering) in the traveling direction of implanted ions is generated by the collision of atoms included in the silicon substrate 2 with the implanted ions. As a result, the traveling direction of the ions implanted downward is slanted to the gate side, and thus the impurity region is expanded in a transverse direction. Particularly, when the traveling direction of the ions after scattering is a direction which easily gives rise to channeling, the ions may intrude into the extension region 5 considerably beyond the assumption made from the implantation energy. This phenomenon is called secondary channeling. For this reason, the distance 8 from the end of the sidewall spacer 6 to the end of the impurity region is decreased by forming the impurity region more deeply. In addition, the distance 8 decreases by using an element having a small mass.

With scaling of the transistor, the junction depth of the diffusion layer is reduced. As a result, the distance between silicide formed in the diffusion layer and the p-n boundary of the diffusion layer decreases, and thus an increase in the junction leakage is brought about. For this reason, it is preferable, in order to realize a low-leakage transistor, that the source and drain region 7 is deeply formed in a region in which the silicide is formed, and only the extension region 5 affecting a short channel effect of the gate end is formed shallowly.

However, with scaling of the transistor, scaling also proceeds with respect to the width of the sidewall spacer 6. For this reason, when the source and drain region 7 is formed, the influence increases due to the expansion of the impurity region to the inside thereof rather than the sidewall spacer 6 (decrease in the distance 8).

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

First Embodiment

A method of manufacturing a semiconductor device according to the first embodiment will be described.

Figure 8A:
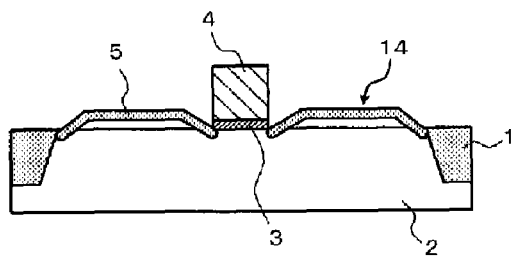
FIGS. 8A to 8E are process cross-sectional views illustrating a portion of the manufacturing procedure of the semiconductor device according to the embodiment of the invention.

FIGS. 4A to 4D show cross-sectional views of a process of manufacturing a pMISFET according to the first embodiment. FIG. 8A shows a schematic diagram of an elevated structure 14 according to the first embodiment.

The method of manufacturing the semiconductor device according to the embodiment is provided, in which a silicon substrate 2 is prepared, where a gate electrode 4 disposed over the semiconductor substrate (silicon substrate 2) with a gate insulating film 3 interposed therebetween, a sidewall spacer 6 disposed in the side of the gate electrode 4, and a region (region including an extension region 5), disposed in the silicon substrate 2 corresponding to both sides of the gate electrode 4, that includes a first conductivity-type source and drain region having an elevated structure 14 above the interface between the gate insulating film 3 and the silicon substrate 2 are formed, the method including: firstly implanting a first impurity in the region including the source and drain region with a concentration equal to or less than $1E14$ atoms/$cm^2$, when a silicide region (source and drain electrode) is formed over the source and drain region, on the conditions that the concentration peak of the first impurity of a first conductivity type is located more deeply than the interface between the silicide region and the silicon substrate 2; secondly implanting a second impurity in the region (region including a source and drain region 10) including the source and drain region, on the conditions that the concentration peak of the second impurity of a first conductivity type, having a smaller mass than that of the first impurity, is located more shallowly than the concentration peak of the first impurity; and thirdly high-temperature millisecond annealing the silicon substrate 2, subsequently to the step of firstly implanting the first impurity and the step of secondly implanting the second impurity.

The "elevated structure" in this specification means a transistor structure in which the surface of the source and drain region is formed above the surface of the substrate.

First, an element isolation region 1 is formed in the p-type silicon substrate 2. Subsequently, an n-well region is formed by performing implantation of an impurity which is an n-type conductive material. Subsequently, a p-well region is formed by performing implantation of an impurity which is a p-type conductive material (not shown). The gate insulating film 3 is formed by performing plasma nitridation after a silicon thermal oxide film is formed. Polysilicon having a thickness of 100 nm is formed on the gate insulating film 3. By a patterning method using a photolithographic technique, phosphorus which is an n-type impurity is selectively implanted only in polysilicon of a gate electrode region of an nMISFET, and boron which is a p-type impurity is selectively implanted only in polysilicon of a gate electrode region of a pMISFET. The gate electrode 4 is formed by performing a patterning process using the photolithographic technique.

Subsequently, as shown in FIG. 8A, the silicon substrate 2 is elevated by growing silicon through selective epitaxial growth. Thereby, the elevated structure 14 can be formed.

Subsequently, a resist mask is formed in a PMISFET region. On the other hand, the p-type source and drain extension region 5 is formed by performing source and drain extension implantation of a Halo and p-type impurity in the PMISFET region. The resist mask is removed by sulfuric acid-hydrogen peroxide mixture cleaning or the like. Meanwhile, the formation of the elevated structure 14 may be performed after the Halo implantation and before the source and drain extension implantation.

Figure 4A:
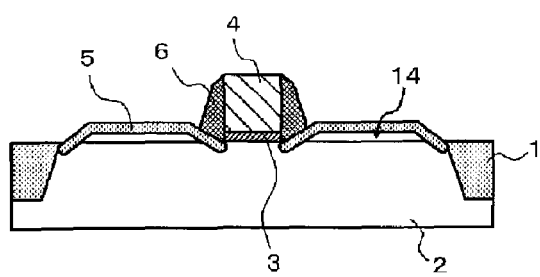
FIGS. 4A to 4D are process cross-sectional views illustrating a manufacturing procedure of a semiconductor device according to a first embodiment.

Subsequently, a silicon oxide film having a thickness of 15 nm is formed. As shown in FIG. 4A, the sidewall spacer 6 is formed by performing dry etching (reactive ion etching, RIE).

Figure 4B:
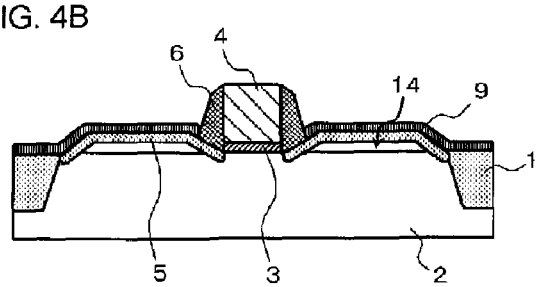

Subsequently, as shown in FIG. 4B, an insulating film 9 (oxide film) is formed on a region (elevated structure 14) including the extension region 5 by a chemical vapor deposition (CVD) method. Here, it is not preferable to form the insulating film 9 as a thermal oxide film because silicon of the silicon substrate 2 is consumed and the impurities in the gate electrode 4 are diffused to the outside due to a high temperature.

Figure 4C:
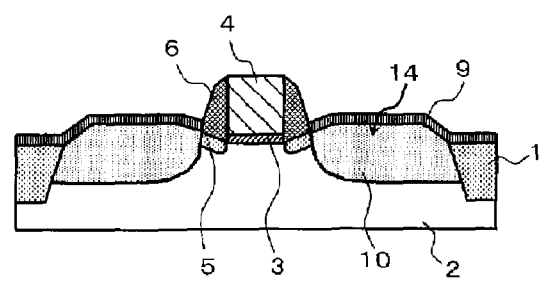
Figure 4D:
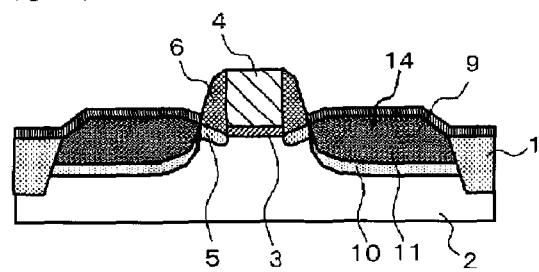

Subsequently, as shown in FIG. 4C, the source and drain region 10 is formed in the elevated structure 14 and the silicon substrate 2 (region including the extension region 5) by performing implantation of a p-type first impurity. Subsequently, as shown in FIG. 4D, a high-concentration impurity region 11 is formed in the source and drain region 10 by implanting a p-type second impurity having a smaller mass than that of the first impurity.

Here, the implantation energy and the dose amount are set so that a peak position of distribution of the first impurity of the source and drain region 10 is located below the interface between a silicide electrode to be later formed, as a source and drain electrode, and the source and drain region 10.

In addition, the implantation energy and the dose amount are set so that a peak position of distribution of the second impurity of the high-concentration impurity region 11 is located above the peak position of distribution of the first impurity of the source and drain region 10.

In the embodiment, for example a peak concentration of the first impurity is of the order of $1.5E19$ atoms/cm$^3$, and on the other hand, a peak concentration of the second impurity is of the order of $1.2E20$ atoms/cm$^3$.

Here, it is possible to appropriately adjust, for example, the implantation energy, the dose amount, types of the impurities, the thickness of the insulating film (sacrificial film), the thickness of the elevated structure 14 and the like, in order to control the positions of concentration peaks of the first impurity and the second impurity.

Further, in the embodiment, it is possible to use, for example, an SIMS analysis in analyzing the impurities. In particular, it is possible to perform the impurity analysis of types of the impurities, the concentration of the impurities and the like by the SIMS of chipping the source and drain region 10 from the rear surface thereof.

The high-temperature millisecond annealing is applied in order to activate the implanted impurities. The annealing conditions are, for example, given as a substrate temperature of 600° C., a peak temperature of 1300° C., and a peak heating time of 5 milliseconds.

A nickel silicide electrode (source and drain electrode), which is not shown, is formed on the source and drain region 10. The thickness of nickel silicide is, for example 15 nm.

In this manner, the semiconductor device according to the embodiment is obtained.

Next, the semiconductor device according to the embodiment will be described.

FIG. 4C shows a portion of the semiconductor device according to the embodiment.

The semiconductor device according to the embodiment is provided, including an MISFET which includes: a substrate (silicon substrate 2); a gate insulating film 3 disposed over the silicon substrate 2; a gate electrode 4 disposed over the gate insulating film 3; a sidewall spacer 6 formed in the side of the gate electrode 4; a region including a first conductivity-type source and drain region (source and drain region 10 and high-concentration impurity region 11), disposed in the silicon substrate 2 corresponding to both sides of the gate electrode 4, that has an elevated structure 14 above the interface between the gate insulating film 3 and the silicon substrate 2; and a silicide region (source and drain electrode), which is not shown, formed over the source and drain region, wherein the first conductivity-type source and drain region includes a first impurity of a first conductivity type, and a second impurity of a first conductivity type having a smaller mass than that of the first impurity, the peak concentration of the first impurity is equal to or less than $1E20$ atoms/cm$^3$, the concentration peak of the first impurity is located below the interface between the silicide region (source and drain electrode) and the silicon substrate 2, the peak concentration of the second impurity is equal to or more than $1E20$ atoms/cm$^3$, and the concentration peak of the second impurity is located above the concentration peak of the first impurity.

In the embodiment, the peak concentration of the first impurity may be set to, for example, equal to or more than $1E19$ atoms/cm$^3$, and the peak concentration of the second impurity may be set to, for example, equal to or less than $5E21$ atoms/cm$^3$.

The operational effects of the embodiment will be described.

(1) The source and drain region is formed by the implantation of a plurality of impurities including the first and second impurities, and the mass of the first impurity implanted in a deep region is made larger, to thereby suppress the amount of generation of the secondary channeling at the time of implantation of the second impurity. Thereby, it is possible to obtain a deep source and drain region while decreasing the intrusion of ions into the extension region. Thereby, it is possible to suppress a short channel effect.

In addition, there is a problem that an element, such as indium or antimony, having a large mass has a low solid solubility, compared to an element such as boron or phosphorus, having a small mass. However, in the embodiment, since using the high-temperature millisecond annealing allows even an element having a low solid solubility to be made soluble at a high concentration, good device characteristics are obtained.

The amount of the crystal defects that can be removed is maintained even in the high-temperature millisecond annealing by setting the implantation amount of the first impurity to be implanted to equal to or less than 1E14 atoms/cm². It is possible to obtain the MISFET having a low junction leakage even under the high-temperature millisecond annealing by using a light element in a shallow section.

In the formation of the source and drain electrode performed after the annealing treatment of activation, the impurities in the silicide are segregated to the interface between the silicide and the semiconductor substrate by extrusion of the silicide to be formed. At this time, the first impurity having a large mass has a high segregation ratio, and exists in the interface portion at a high concentration. However, since the first impurity does not essentially have a high solid solubility, the first impurity segregated after the application of the high-temperature millisecond annealing causes defects to remain.

Consequently, in the embodiment, the peak of the first impurity having a large mass is located below the interface between the silicide and the semiconductor substrate. For this reason, it is possible to obtain the semiconductor device having high reliability by avoiding a situation where the first impurity segregated after the application of the high-temperature millisecond annealing becomes a cause of remaining defects.

In addition, it is possible to further suppress the short channel effect by lifting the semiconductor substrate (silicon substrate 2) to the upper portion through the adoption of the elevated structure 14.

Figures 3A, 3B, 3C:
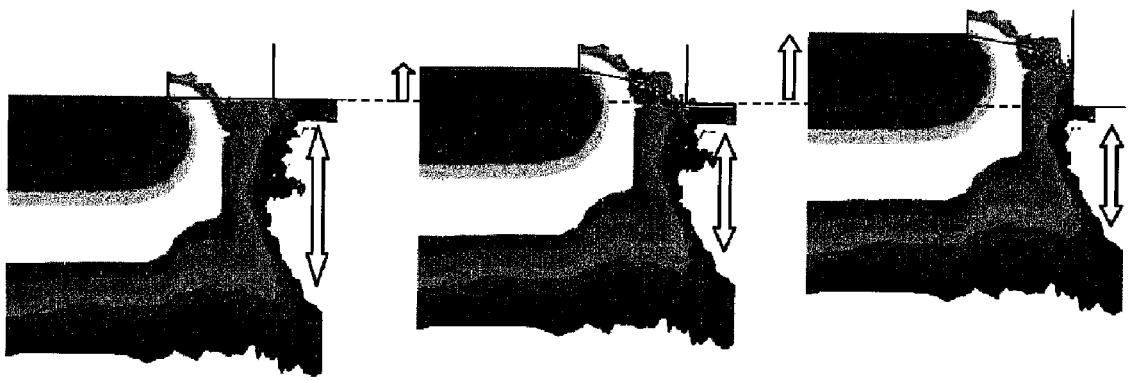
FIGS. 3A to 3C are diagrams illustrating a change in a position of intruding into a secondary channeling extension region depending on the amount of elevation.

Here, even in the case where the source and drain region is deeply formed in order to realize a low leakage (FIG. 3A), the position of the impurities intruding into the extension region due to the secondary channeling gets closer to the extension region, as the source and drain region portion is further lifted (FIGS. 3B and 3C). That is, the distance from the end of the sidewall spacer 6 to the end of the source and drain region 10 becomes larger. For this reason, the short channel effect can be deteriorated by the elevated structure. As stated from the above, in the semiconductor device having the elevated structure, it is possible to suppress the short channel effect while reducing the junction leakage.

(2) Although, relatively, the element having a large mass does not easily give rise to the secondary channeling, the channeling in a longitudinal direction (channeling in a longitudinal direction unaccompanied by scattering) is generated as disclosed in Japanese Unexamined Patent Publication No. 2003-31798. In the high-temperature millisecond annealing unlike spike annealing having been used in the related art, the impurity implantation in a deeper position than expected causes the remaining defect.

On the other hand, in the embodiment, the insulating film 9 is formed on the source and drain region 10, and then the impurity implantation can be performed in a state of being covered thereon with the insulating film 9 (sacrificial film). It is possible to reduce the channeling and to stably dispose the impurities at a recoverable position even in the high-temperature millisecond annealing by disposing the insulating film 9 on the substrate (silicon substrate 2) in this way. Thereby, the effect of a reduction in the junction leakage can be obtained.

Figure 2:
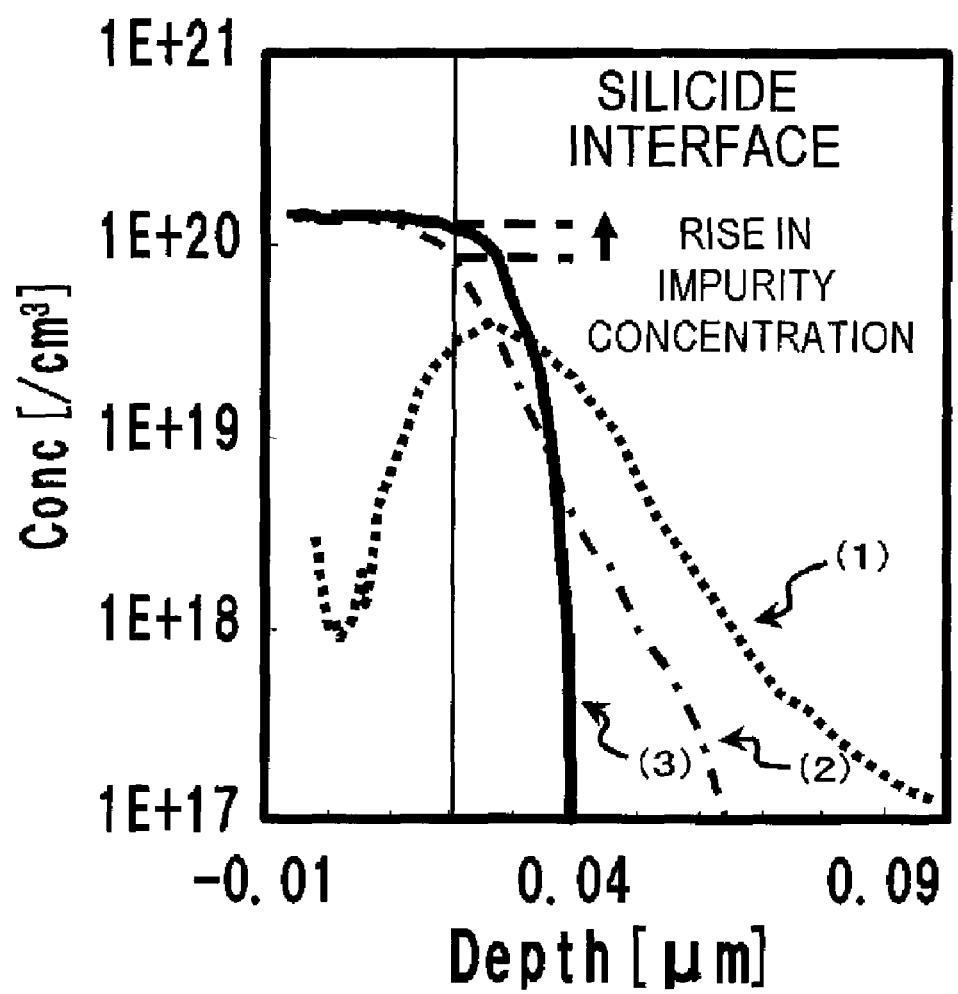
FIG. 2 is a diagram illustrating the distribution of impurities implanted in source and drain regions according to the embodiment.

(3) FIG. 2 shows the distribution of the impurities implanted in the source and drain region according to the embodiment. (1) of FIG. 2 shows the first impurity (indium), (2) shows the second impurity (boron) before the implantation of the first impurity, and (3) shows the second impurity (boron) after the implantation of the first impurity.

In the embodiment, although the implantation amount of the first impurity is set to equal to or less than 1E14 atoms/cm², the crystal defect caused by the implantation is generated. Because of such an effect, the distribution of the second impurity implanted subsequently has a high concentration in the vicinity of the peak of the first impurity as shown in (3) of FIG. 2. In addition, since the first impurity is located below the silicide interface, it is possible to dispose the second impurity in the vicinity of the silicide interface in the state of a high concentration before the millisecond annealing is applied to the second impurity. Thereby, it is possible to reduce resistance of the silicide interface (silicide source and drain electrode). As seen from the above, since the first impurity is implanted before the second impurity is implanted, the high-performance MISFET can be obtained in the embodiment.

In addition, it is preferable to form a low-resistance junction in order to obtain the high-performance MISFET. The channel resistance between the source and the drain is reduced by the reduction in the size of the MISFET. On the other hand, the silicide electrode or the contact resistance is not reduced proportionately to the size reduction. The resistance between the silicide electrode and the semiconductor substrate (silicon substrate 2) can be reduced by disposing the high-concentration impurities at the interface therebetween in the embodiment. For this reason, it is preferable to dispose the high-concentration impurities at the silicide interface in order to obtain the high-performance MISFET.

(4) It is preferable to narrow a gap between the MISFETs from the viewpoint of integration. For this reason, the thickness of the sidewall spacer 6 is required to be made smaller. According to ITRS2007, the thickness of silicide of a bulk-type MISFET is in the range of 9 nm to 17 nm. In addition, the formation of silicide is stabilized by etching the source and drain region by 5 nm or so at the time of the formation of silicide. Since the junction of the silicide and the source and drain without a certain degree of distance causes an increase in the junction leakage, the depth of the source and drain region before the formation of silicide needs to be at least 30 nm. When boron, which is a typical P-type impurity having a small mass, is implanted so that the source and drain region is 30 nm in depth, the impurity is intruded by about 15 nm in an extension direction. For this reason, when the thickness of the sidewall spacer 6 according to the embodiment is equal to or less than 15 nm, the advantage of the invention becomes more remarkable.

As seen from the above, it is possible to realize the high integration, the suppression of the short channel effect, and the low junction leakage in a microscopic device to which the high-temperature millisecond annealing is applied.

(5) The semiconductor device according to the invention can be manufactured by the above-mentioned method of manufacturing the semiconductor device according to the invention. The concentration peak of the first impurity of the source and drain region is located at a deeper position than that of the silicide interface, and the peak concentration thereof is suppressed to equal to or less than 1E20 atoms/cm³, to thereby allow the MISFET having a small crystal defect, in which the thickness of the sidewall spacer is equal to or less than 15 nm to be formed.

(6) In addition, there is a problem that the elements having a large mass include a large number of materials with low solid solubility. On the other hand, since an unsteady state due to a rapid change in temperature exists in the high-temperature millisecond annealing, it is possible to introduce even a material having a low solid solubility into the crystal at a high concentration. Therefore, there is achieved a remarkable effect that a higher activation rate can be obtained by the combination of the high-temperature millisecond annealing and the implantation conditions disclosed in this specification. In addition, since the high-temperature millisecond annealing has a small diffusion amount of the impurities, the substantial effect cannot be exhibited simply by changing only the annealing to the high-temperature millisecond annealing from the junction design of the related art. The conditions disclosed in this specification are manifested by experiments and calculations conducted by the inventor with respect to the effective conditions in the case where the high-temperature millisecond annealing is applied.

The effects of the embodiment will be further described while being compared with the related art.

Figure 5:
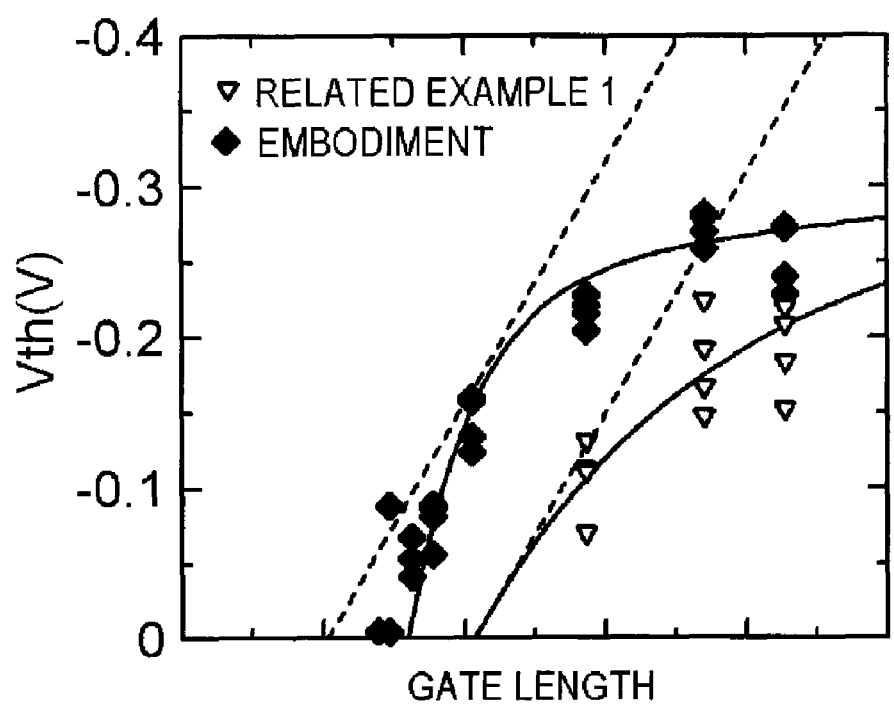
FIG. 5 is a diagram illustrating the roll-off characteristics of a threshold voltage (Vth)

FIG. 5 shows the roll-off characteristics of threshold voltages (Vth) of the pMISFET of related example 1 and the pMISFET of the embodiment.

In the manufacture of the pMISFET of related example 1, the high-temperature millisecond annealing is performed by deeply implanting boron in the source and drain region after the sidewall is formed. On the other hand, in the manufacture of the PMISFET of the embodiment, the high-temperature millisecond annealing is performed after indium is deeply implanted, and boron is shallowly implanted. The depths of the source and drain regions of related example 1 and the embodiment are formed by substantially the same conditions.

However, as shown in FIG. 5, it is known that the short channel effect can be suppressed in the embodiment as compared with related example 1.

Figure 6:
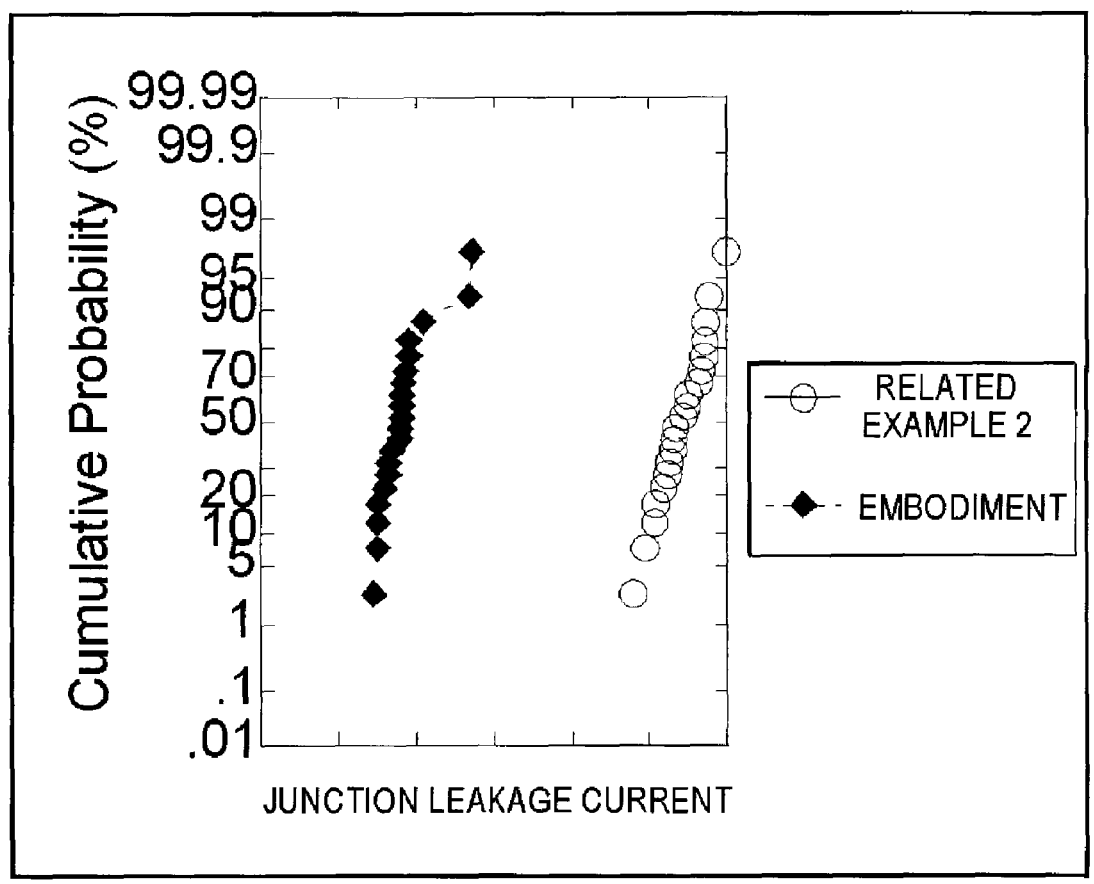
FIG. 6 is a diagram illustrating the junction leakage characteristics.

FIG. 6 shows the junction leakage characteristics of the pMISFET of related example 2 and the pMISFET of the embodiment.

In the manufacture of the pMISFET of related example 2, the high-temperature millisecond annealing is performed by implanting boron in the source and drain region after amorphization of the source and drain region by germanium is performed. On the other hand, in the manufacture of the pMISFET of the embodiment, the high-temperature millisecond annealing is performed after indium is deeply implanted, and boron is shallowly implanted. The roll-off characteristics of Vth of related example 2 and the embodiment are made by substantially the same conditions.

However, as shown in FIG. 6, it is known that the junction leakage is reduced in the embodiment as compared with related example 2.

As seen from the above, in the embodiment, it is known that a device is obtained in which the diffusion in a transverse direction is suppressed, and thus the shallow junction, the low parasitic resistance, and the low junction leakage are simultaneously achieved.

Further, in the technique disclosed in Japanese Unexamined Patent Publication No. 2005-33098, there is a problem that indium has a low solid solubility, and thus there may be a case where most of the indium cannot be activated to thereby remain in the crystal even when this material is used.

On the other hand, in the embodiment, it is possible to activate indium using the high-temperature millisecond annealing. That is, since an unsteady state due to a rapid change in temperature exists in the high-temperature millisecond annealing, it is possible to activate even a material having a low solid solubility. Therefore, there is achieved a remarkable effect that a higher activation rate can be obtained by the combination of the high-temperature millisecond annealing and indium. In addition, since the high-temperature millisecond annealing has a small diffusion amount of the impurities, the substantial effect cannot be exhibited simply by changing only the annealing to the high-temperature millisecond annealing from the junction design of the related art.

The conditions disclosed in this specification are manifested by experiments and calculations conducted by the inventor with respect to the effective conditions in the case where the high-temperature millisecond annealing is applied.

In addition, there is a problem that the semiconductor device disclosed in Japanese Unexamined Patent Publication No. 2003-31798 has low productivity.

The cause of the low productivity is in that a cover oxide film cannot be formed when the source and drain region is formed. The source and drain region is generally formed by covering regions other than the region with a resist and performing the implantation of the introduced impurities. Here, removal of the resist used at the time of the impurity implantation is performed by, for example, a chemical solution using a sulfuric acid-hydrogen peroxide mixture (SPM), an ammonium hydrogen peroxide mixture (APM) or a diluted hydrofluoric acid (DHF), or asking using oxygen plasma, or the combination thereof. The surface of the silicon substrate is considerably etched by these treatments. For example, the APM has an action of directly etching the surface of the silicon substrate. Otherwise, the silicon oxide film (chemical oxide film), having a low film density, formed by the SPM or the ashing is easily etched by the DHF. The surface of the silicon substrate is etched as a result of this repetition. A method of preventing this etching includes a method of forming an oxide film and the like on the surface of the substrate. However, in the manufacturing method disclosed in Japanese Unexamined Patent Publication No. 2003-31798, the oxide film cannot be formed on the surface of the substrate, and when processes of coating, exposure and development are executed once again after peeling-off in any of the failures, the semiconductor substrate has a greater amount to be etched at the time of peel-off of the resist and the like. For this reason, a tolerance for exposure reworking is reduced.

In addition, the exposed semiconductor substrate forms a natural oxide film on the surface thereof with the passing of time. There is no problem when the natural oxide film is removed by the DHF and the like immediately before the impurity implantation process, but since the time taken from the DHF treatment to the impurity implantation process may be limited, the manufacturing process becomes complicated.

On the other hand, in the embodiment, the cover oxide film (insulating film 9) can be formed when the source and drain region is formed, and therefore it is possible to solve the above-mentioned problem.

Second Embodiment

The second embodiment is different from the first embodiment in that the upper portion of the silicon substrate 2 is covered with an insulating film 12 before the extension region 5 is formed.

FIGS. 7A to 7H show cross-sectional views of a process of manufacturing the MISFET according to the second embodiment.

Figure 7A:
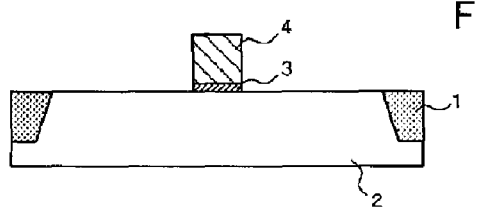
FIGS. 7A to 7H are process cross-sectional views illustrating a manufacturing procedure of the semiconductor device according to a second embodiment.
Figure 7B:
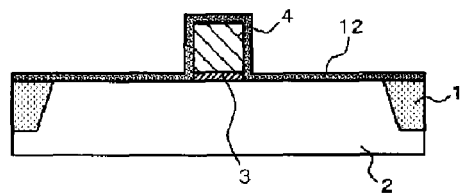

As shown in FIG. 7A, similarly to the first embodiment, the gate insulating film 3 is formed on the silicon substrate 2, and the gate electrode 4 is formed on the gate insulating film 3. Subsequently, as shown in FIG. 7B, the insulating film 12 is formed so as to cover the surface of the silicon substrate 2 (extension region to be formed) and the surface of the gate electrode 4.

Figure 7C:
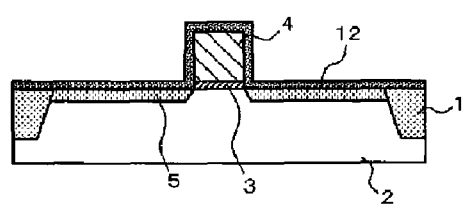
Figure 7D:
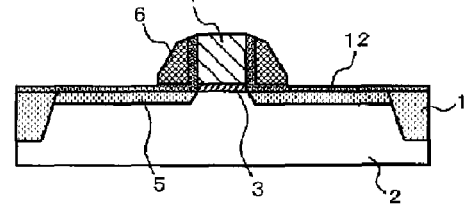

Subsequently, as shown in FIG. 7C, a resist mask is formed in a PMISFET region, and the p-type extension region 5 is formed by performing source and drain extension implantation of a Halo and p-type impurity in the PMISFET region. The resist mask is removed by sulfuric acid-hydrogen peroxide mixture cleaning. Subsequently, a silicon oxide film having a thickness of 15 nm is formed. As shown in FIG. 7D, the sidewall spacer 6 is formed by performing dry etching (Reactive Ion Etching, RIE).

Figure 7E:
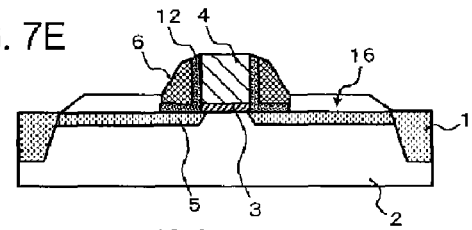

As shown in FIG. 7E, the surface of the substrate (silicon substrate 2) is elevated by growing silicon through selective epitaxial growth. Thereby, an elevated structure 16 (region including the extension region 5) is formed.

Figure 7F:
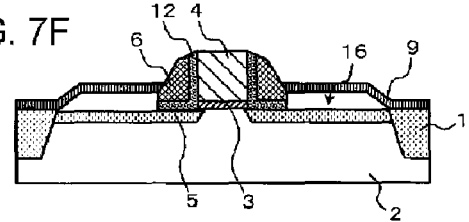
Figure 7G:
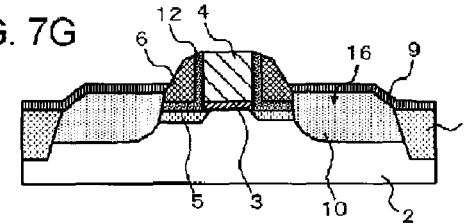
Figure 7H:
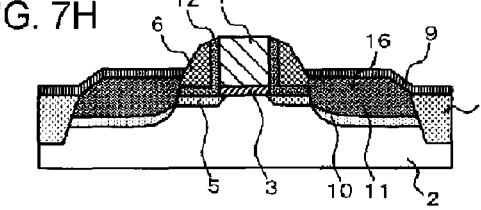

Subsequently, as shown in FIG. 7F, the insulating film 9 is formed on the elevated structure 16. As shown in FIG. 7G, the source and drain region 10 is formed by implanting the p-type first impurity in a region including the extension region 5. Subsequently, as shown in FIG. 7H, the high-concentration impurity region 11 is formed by implanting the p-type second impurity having a smaller mass than that of the first impurity in the source and drain region 10.

At this time, the implantation energy and the dose amount are set so that a peak position of distribution of the first impurity of the source and drain region 10 is located below the interface between a silicide electrode to be later formed and the source and drain region. In addition, the implantation energy and the dose amount are set so that a peak position of distribution of the second impurity of the high-concentration impurity region 11 is located above the peak position of distribution of the first impurity of the source and drain region 10. For example, when the thickness of nickel silicide (silicide region) is 15 nm, the source and drain region 10 is formed as a source and drain electrode with indium of 100 KeV 1E14 atoms/cm$^2$, and the high-concentration impurity region 11 is formed with boron of 2 KeV 3E15 atoms/cm$^2$.

The high-temperature millisecond annealing is applied in order to activate the implanted impurities. The annealing conditions are, for example, given as a substrate temperature of 600° C., a peak temperature of 1300° C., and a peak heating time of 5 milliseconds. The nickel silicide electrode is formed on the elevated structure 16 (region including the source and drain region 10). The thickness thereof is, for example, 15 nm.

As seen from the above, the semiconductor device according to the second embodiment is obtained.

The same effect as that of the first embodiment is also obtained with respect to the semiconductor device according to the second embodiment.

Third Embodiment

Figure 12:
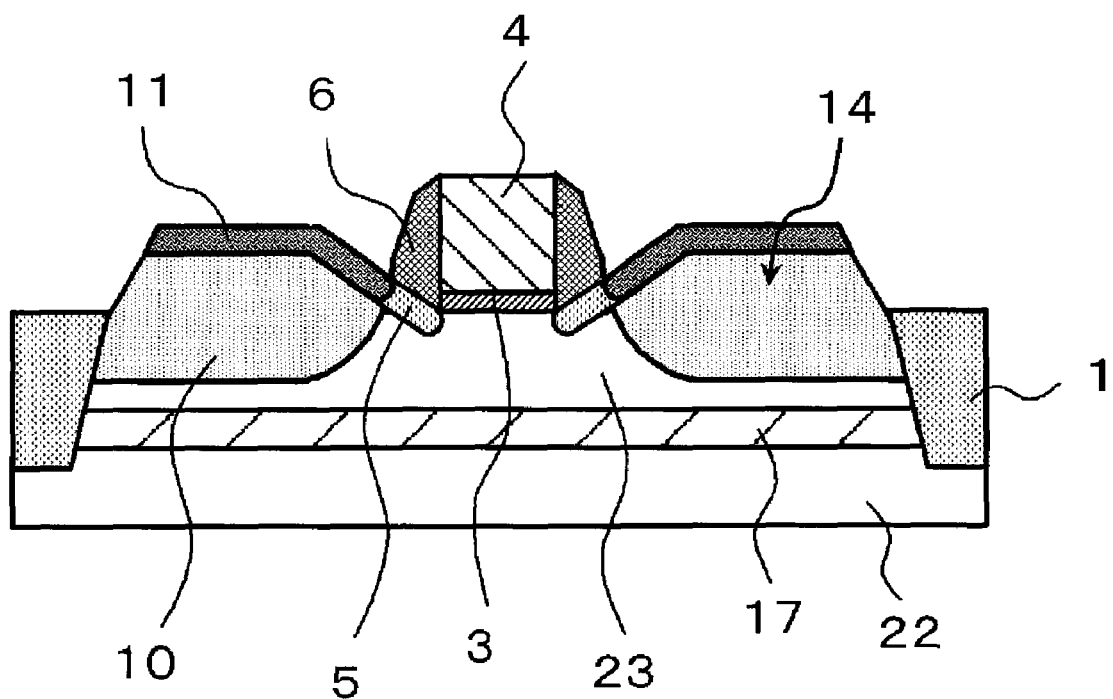
FIG. 12 is a cross-sectional view schematically illustrating the semiconductor device according to a third embodiment.

FIG. 12 schematically shows the semiconductor device according to the third embodiment.

Figure 8D:
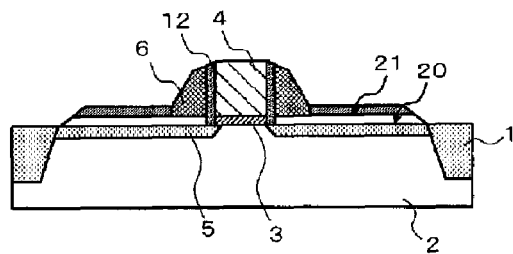
Figure 8B:
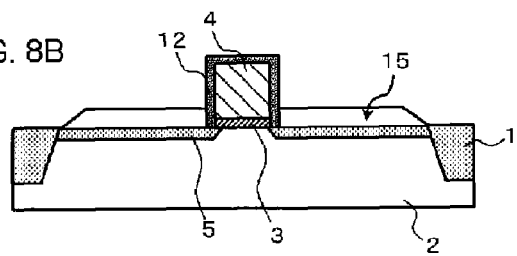
Figure 8E:
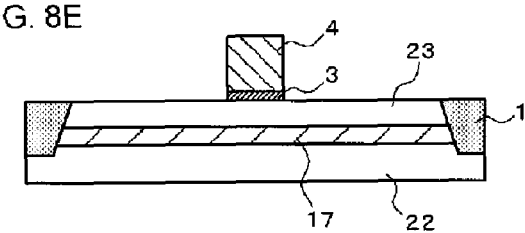

The third embodiment is different from the first embodiment in that an SOI substrate shown in FIG. 8E is used in place of the silicon substrate. The p-type SOI substrate may be a substrate having a silicon oxide layer 17 between a silicon layer 22 and a silicon layer 23.

The semiconductor device of the third embodiment is constituted such that the concentration peak of the first impurity is deeper than the interface between the gate insulating film and the substrate (SOI substrate), the concentration peak of the second impurity is shallower than the interface between the gate insulating film and the SOI substrate, and the bottom of the silicide region (source and drain silicide electrode) is shallower than the interface between the gate insulating film and the SOI substrate (FIG. 12).

In the embodiment, the concentration peak of the first impurity is deeper than the interface between the gate insulating film 3 and the substrate (SOI substrate). Therefore, since a sufficient distance can be taken between the boundary of the p-n junction formed by the first impurity and the silicide, the operational effect of a reduction in the junction leakage is obtained.

In addition, since the bottom of the silicide region (source and drain silicide electrode) is shallower than the interface between the gate insulating film 3 and the SOI substrate while the silicide having a sufficient thickness with the elevated structure 14 is formed, there is obtained the operational effect of a reduction in resistance (parasitic resistance) with respect to a current flowing through the gate from the silicide.

Since the concentration peak of the second impurity is shallower than the interface between the gate insulating film 3 and the SOI substrate, in other words, the concentration peak exists in the vicinity of the interface between the silicide and the silicon substrate, it is possible to lower the Schottky resistance of the silicide interface.

Although these effects may be obtained individually, obtaining concentration profiles of such impurities gives rise to a deterioration of the short channel effect. There may be obtained a low junction leakage and low-resistance transistor capable of being satisfactorily turned on and off even in a microscopic transistor having a small deterioration of the short channel effect with a size equal to or less than 32 nm by the combination of the elevated structure and multiple steps of impurity implantation.

In addition, the short channel effect is better controlled as the silicon layer 23 existing on the silicon oxide layer 17 is thinner, but a limitation is placed on the thickness of the silicide in this case. The formation of the silicide is performed by consuming the silicon layer 23. However, the whole silicidation of the silicon layer 23 in a longitudinal direction and thus the contact of the silicide with the silicon oxide layer 17 have a hugely adverse affect on the device characteristics. The operational effect particular to low resistance by obtaining the silicide having a stable thickness in a device including such an extremely-thin silicon layer 23 in the elevated structure 14 is achieved.

As described above, although the embodiments of the invention have been set forth with reference to the drawings, they are merely illustrative of the invention, and various configurations other than those stated above can be adopted.

Figure 9A:
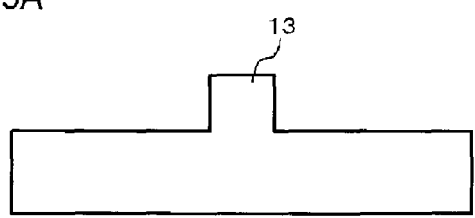
FIGS. 9A to 9C and 9A' to 9C' are process cross-sectional views illustrating a modified example of the manufacturing procedure of the semiconductor device according to the embodiment.
Figure 9A:
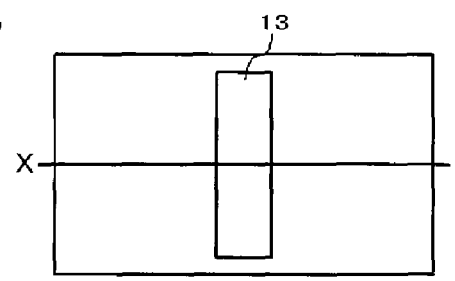
Figure 9B:
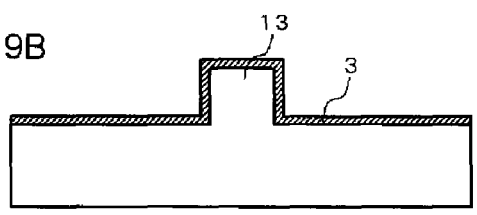
Figure 9B:
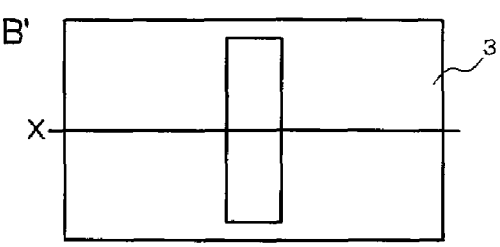
Figure 9C:
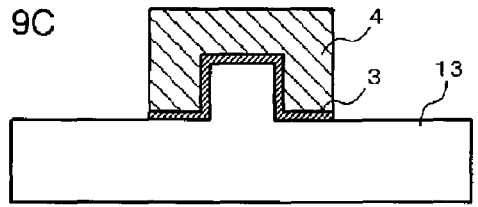
Figure 9C:
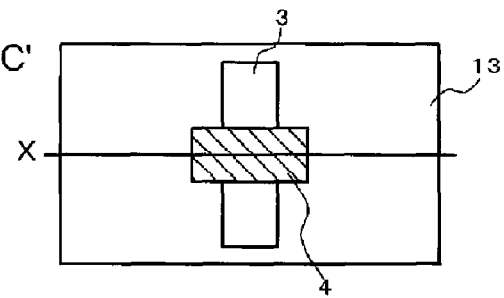
Figure 10A:
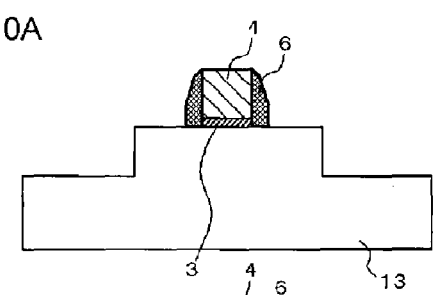
FIGS. 10A to 10C and 10A' to 10C' are process cross-sectional views illustrating another modified example of the manufacturing procedure of the semiconductor device according to the embodiment.

For example, in the above-mentioned embodiments, a silicon convex portion 13 may be provided in the silicon substrate (FIGS. 9A and 9A'). FIGS. 9A' to 10C' show top views. FIGS. 9A to 9C show cross-sectional views of line segments X, and FIGS. 10A to 10C show cross-sectional views of line segments Y.

An n-well region is formed by performing implantation of an impurity which is an n-type conductive material, and next, a p-well region is formed by performing implantation of an impurity which is a p-type conductive material (not shown). As shown in FIG. 9B, the gate insulating film 3 is formed by performing plasma nitridation after the silicon thermal oxide film is formed. Subsequently, as shown in FIG. 9C, polysilicon having a thickness of 50 nm is formed on the gate insulating film 3, and the gate electrode 4 is formed by performing a patterning process using the photolithographic technique.

Subsequently, the silicon oxide film having a thickness of 15 nm is formed. As shown in FIG. 10A, the sidewall spacer 6 is formed by performing dry etching (reactive ion etching, RIE). Here, the elevated structure may be formed before the sidewall spacer 6 is formed (similarly to the first embodiment), and the elevated structure may be formed after the sidewall spacer 6 is formed (similarly to the second embodiment). At this time, the elevated structure may be formed on the silicon convex portion 13 (not shown).

Figure 10B:
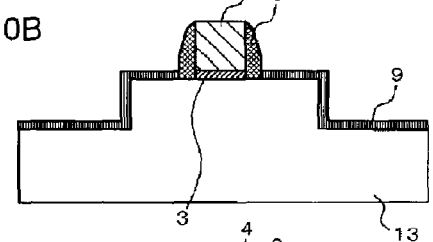
Figure 10C:
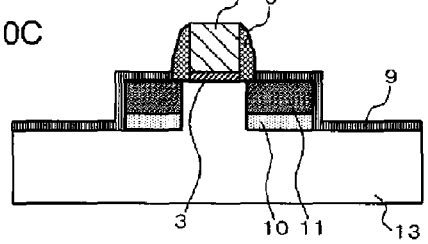
Figure 10A:
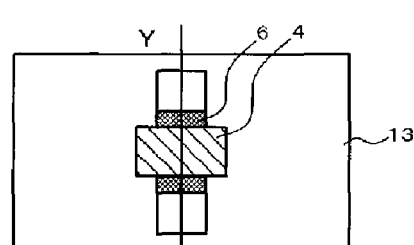
Figure 10B:
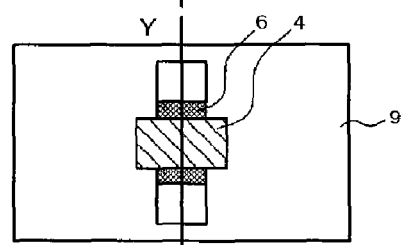
Figure 10C:
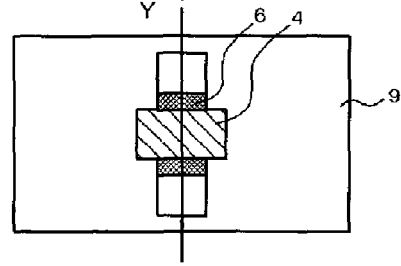

Subsequently, as shown in FIG. 10B, the oxide film 9 is formed in the source and drain region to be formed. As shown in FIG. 10C, the source and drain region 10 is formed by performing implantation of the p-type first impurity, and the high-concentration impurity region 11 is formed by implanting the p-type second impurity having a smaller mass than that of the first impurity. At this time, the implantation energy and the dose amount are set so that the peak position of impurity distribution of the source and drain region 10 is located below the interface between the silicide electrode to be later formed and the source and drain region. In addition, the implantation energy and the dose amount are set so that the peak position of impurity distribution of the high-concentration impurity region 11 is located above the peak position of impurity distribution of the source and drain region 10. A nickel silicide electrode is formed by applying the high-temperature millisecond annealing in order to activate the implanted impurities.

Figure 11A:
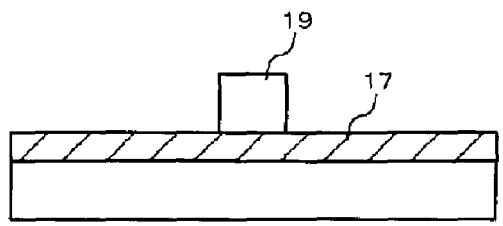
FIGS. 11A and 11A' are process cross-sectional views illustrating a portion of the modified example of the manufacturing procedure of the semiconductor device according to the embodiment of the invention.
Figure 11A:
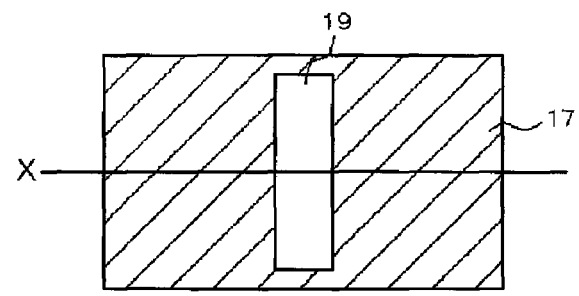

In the above-mentioned modified example, as shown in FIGS. 11A and 11B, the substrate having a silicon convex portion 19 may be used on the substrate having the silicon oxide layer 17. FIG. 11A is a diagram of the semiconductor substrate when seen in a top view, and FIG. 11A is a cross-sectional view taken along line segment X which is drawn in FIG. 10A'.

In the embodiments, a structure in which the surface of the source and drain is made higher by further growing the Si crystal at the source and drain portion of the transistor may be used as the elevated structure.

Figure 8C:
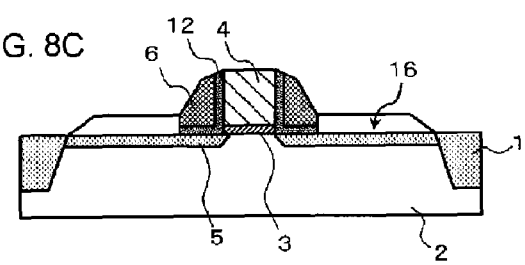

Here, after the gate electrode 4 is formed, the substrate may be elevated by growing silicon through selective epitaxial growth as in the elevated structure 14 shown in FIG. 8A, and an elevated structure 15 shown in FIG. 8B. Thereby, it is possible to obtain an effect of improving the short channel effect. In addition, after the sidewall spacer 6 is formed, the substrate may be elevated by growing silicon through selective epitaxial growth as in the elevated structure 16 shown in FIG. 8C. In addition, a first elevated structure 20 and a second elevated structure 21 may be formed by implementing multiple steps of elevations as shown in FIG. 8D.

The elevated structure may be provided in at least a portion on the semiconductor substrate (particularly, the source and drain region), and may be provided in the whole surface of the semiconductor substrate. In addition, the elevated structure may or may not be in contact with the side of the gate electrode 4. Further, a flat surface may be formed on a portion of the surface of the elevated structure. The thickness of the elevated structure from the surface of the silicon substrate 2 may be set to, for example, a half or ⅓ or so of the thickness of the gate electrode 4.

In the embodiments, the p-type silicon substrate 2 may use a germanium substrate.

In the embodiments, the gate insulating film 3 may be a silicon oxide film or $Si_3N_4$, or may use materials including Hf, Al, Ba, Ti, La, Ta, Ce, Sr, Pr, Zr and the like, and Si, O and N.

In the embodiments, the gate electrode 4 may use amorphous silicon or a metallic material in place of polysilicon. In addition, a structure in which a portion of the gate is made of polysilicon and a portion thereof is a metal may be used.

In the embodiments, the gate electrode 4 may be removed by a later process, and the electrode may be formed once again.

Further, in the first and second embodiments, the sidewall spacer 6 may be formed before the source and drain extension region 5 is formed, and the source and drain extension region 5 may be formed by removing the sidewall spacer 6 after the source and drain region 10 and the high-concentration impurity region 11 are formed and activated, and then the high-temperature millisecond annealing may be applied thereto.

In the embodiments, the oxide film (insulating film 9) may be an oxynitride film, a nitride film, a natural oxide film and the like.

In the embodiment, the materials used in the formation of the element isolation region 1 and the high-concentration impurity region 11 include Ga, $B_{10}H_{14}$ (decaborane), $B_{18}H_{22}$ (octadecaborane), $C_2B_{10}H_{12}$ (caborane) and the like in addition to B and In. Further, at the time of the formation of the NMISFET, the materials include P, P4, As, $As_4$, Sb and the like.

In the embodiments, the high-temperature millisecond annealing may be performed in a pulse shape of a millisecond unit. Further, in the high-temperature millisecond annealing, a short period of heat treatment is performed at a higher temperature than that in the spike annealing of the related art.

In the high-temperature millisecond annealing according to the embodiments, for example, the substrate temperature may be set to equal to or higher than 300° C. and equal to or lower than 800° C., the peak temperature may be set to equal to or higher than 1200° C. and equal to or lower than a silicon melting point (1410° C.), and the heating time may be set to equal to or more than 100 microseconds and equal to or less than 10 milliseconds.

In the above-mentioned embodiments, the combination of the spike annealing and the high-temperature millisecond annealing, the combination of the SPE and the high-temperature millisecond annealing, or the multiple high-temperature millisecond annealing may be implemented in the annealing of activating the impurities.

In the embodiments, the silicide electrode may use materials obtained by reaction of nickel silicide with Pt, Er, Yb and the like. In addition, PtSi, CoSi, and PaSi may be used in place of the nickel silicide.

It is apparent that the present invention is not limited to the above embodiments, and may be modified and changed without departing from the scope and spirit of the invention.

What is claimed is:

1. A method of manufacturing a semiconductor device, in which a substrate is prepared, where a gate electrode disposed over said substrate with a gate insulating film interposed therebetween, a sidewall spacer disposed in the side of said gate electrode, and a region, disposed in said substrate corresponding to both sides of said gate electrode, that includes a first conductivity-type source and drain region having an elevated structure above a level of an interface between said gate insulating film and said substrate are formed, the method comprising:

firstly implanting a first impurity in said region including the source and drain region with a concentration equal to or less than 1E14 atoms/$cm^2$, when a silicide region is formed over said source and drain region, on the conditions that a concentration peak of said first impurity of a first conductivity type is located more deeply than a bottom of said silicide region;

secondly implanting a second impurity in said region including the source and drain region, on the conditions that a concentration peak of said second impurity of a first conductivity type, having a smaller mass than that of said first impurity, is located more shallowly than the concentration peak of said first impurity; and thirdly high-temperature millisecond annealing said substrate, subsequently to said firstly implanting the first impurity and said secondly implanting the second impurity, wherein implanting, in said step of firstly implanting the first impurity, said first impurity in said source and drain region so that the concentration peak of said first impurity is located more deeply than the level of the interface between said gate insulating film and said substrate, implanting, in said step of secondly implanting the second impurity, said second impurity in said source and drain region so that the concentration peak of said second impurity is located more shallowly than the level of the interface between said gate insulating film and said substrate, and said silicide region is formed so that the bottom of said silicide region is located more shallowly than the level of the interface between said gate insulating film and said substrate.

2. The method of manufacturing the semiconductor device as set forth in claim 1, wherein before said step of firstly implanting the first impurity and said step of secondly implanting the second impurity, an insulating film is formed over said source and drain region, and said step of firstly implanting the first impurity and said step of secondly implanting the second impurity are performed in a state of being covered thereon with said insulating film.

3. The method of manufacturing the semiconductor device as set forth in claim 1, wherein in said step of firstly implanting the first impurity and said step of secondly implanting the second impurity, said step of firstly implanting the first impurity is first performed.

4. The method of manufacturing the semiconductor device as set forth in claim 1, wherein the thickness of said sidewall spacer is equal to or less than 15 nm.

5. The method of manufacturing the semiconductor device, as set forth in claim 1, wherein said substrate is an SOI substrate.

6. A semiconductor device comprising an MISFET which includes:
a substrate;
a gate insulating film disposed over said substrate;
a gate electrode disposed over said gate insulating film;
a sidewall spacer formed in the side of said gate electrode;
a first conductivity-type source and drain region, disposed in said substrate corresponding to both sides of said gate electrode, that has an elevated structure above a level of an interface between said gate insulating film and said substrate; and a silicide region disposed over said source and drain region,
wherein said source and drain region includes a first impurity of a first conductivity type, and a second impurity of a first conductivity type having a smaller mass than that of said first impurity,
a concentration peak of said first impurity is equal to or less than 1E20 atoms/cm$^3$,
the concentration peak of said first impurity is located below a bottom of said silicide region,
a concentration peak of said second impurity is equal to or more than 1E20 atoms/cm$^3$,
the concentration peak of said second impurity is located above the concentration peak of said first impurity,
wherein
the concentration peak of said first impurity is located more deeply than the level of the interface between said gate insulating film and said substrate,
the concentration peak of said second impurity is located more shallowly than the level of the interface between said gate insulating film and said substrate, and
said silicide region is formed so that the bottom of said silicide region is located more shallowly than the level of the interface between said gate insulating film and said substrate.

7. The semiconductor device as set forth in claim 6, wherein the thickness of said sidewall spacer is equal to or less than 15 nm.

8. The semiconductor device as set forth in claim 6, wherein said substrate is an SOI substrate.

* * * * *